US005521535A

United States Patent [19]

Hori

[11] Patent Number: 5,521,535

[45] Date of Patent: May 28, 1996

[54] TRANSISTOR CIRCUIT WITH A SELF-HOLDING CIRCUIT FOR A RELAY

[75] Inventor: Eisaku Hori, Yokohama, Japan

[73] Assignee: Jidosha Denki Kogyo Kabushiki Kaisha, Yokohama, Japan

[21] Appl. No.: 322,337

[22] Filed: Oct. 13, 1994

[30] Foreign Application Priority Data

Oct. 18, 1993 [JP] Japan .................................... 5-260130

[51] Int. Cl.[6] ...................................... H03K 3/037

[52] U.S. Cl. .............................. 327/199; 327/215

[58] Field of Search .............................. 280/707; 307/9.1, 307/10.1, 326; 327/199, 200, 205, 207, 208, 209, 210, 215, 216, 217, 221; 355/206; 364/424.05

*Primary Examiner*—Timothy P. Callahan
*Assistant Examiner*—Jeffrey Zweizig
*Attorney, Agent, or Firm*—Sughrue, Mion, Zinn, Macpeak & Seas

[57] ABSTRACT

A self-holding circuit is provided with an input terminal (2), an output terminal (3), a self returnable push switch (SW2), a first transistor TR1), a first time constant circuit (R3 and C1) having a predetermined charging time constant (T1), a second transistor (TR2), a relay (RL), first and second diodes (D1, D2), a second time constant circuit (R8, R9 and C2) having a predetermined discharging constant (T2), and a third transistor (TR3). The circuit may be switched on by a first pushing operation of the push switch and switched off by a second pushing operation of the same push switch.

4 Claims, 7 Drawing Sheets

TRANSISTOR CIRCUIT WITH A SELF-HOLDING CIRCUIT FOR A RELAY

BACKGROUND OF THE INVENTION

1. Field of the Invention

This invention relates to a self-holding circuit used for maintaining a relay for supplying an electric current to a controller of an automatic cruising control apparatus in an ON-state or an OFF-state.

2. Description of the Prior Art

Heretofore, there has been known a self-holding circuit housed in a controller of the automatic cruising control apparatus as a circuit for maintaining a relay in the ON-state or OFF-state in order to supply and interrupt an electric current to the controller.

In such a cruising control apparatus, by switching on a main switch of the seesaw type in an ON-state of the ignition switch, a relay coil of the relay is excited and the exciting current supply to the relay coil is maintained by the self-holding circuit. Therefore, contacts of the relay are maintained in the closed state, whereby the current supply to the controller is continued.

However, in the aforementioned conventional self-holding circuit, the seesaw type switch to be selected between an ON-state and an OFF-state is used as the main switch. Accordingly, it is not always favourable in operationality of the switch.

SUMMARY OF THE INVENTION

Therefore, it is an object of this invention to provide a self-holding circuit in which it is possible to change over a circuit into the ON-state from the OFF-state or contrary to this, and possible to maintain the circuit in the ON-state or the OFF-state by operating merely one switch of self-returnable type, such as a push button type, for example.

The construction of the self-holding circuit according to this invention as shown in FIG. 1 in order to accomplish the above-mentioned object is characterized by an input terminal (2) supplied with an electric current from a power source (20); an output terminal (3); a manual switch (SW2) of self-returnable type connected to the input terminal (2); a first transistor switching means (TR1) connected to the manual switch (SW2) and changing into a conductive state in response to an ON-state of the manual switch (SW2); a first time constant circuit (R3 and C1) having a charging time constant, connected to the first transistor switching means (TR1) and charged according to the conductive state of the first transistor switching means (TR1); a second transistor switching means (TR2) connected to the first time constant circuit (R3 and C1), connected to the manual switch (SW2) through a first diode (D1) and changing into a conductive state according to a charging current flowing in the first time constant circuit (R3 and C1); a relay (RL) having a relay coil (RL1-1) connected to the second transistor switching means (TR2), a first relay contact (RL1-2) connected to the input terminal (2) and a second relay contact (RL1-3) connected to the output terminal (3); a second diode (D2) connected between the second transistor switching means (TR2) and the second relay contact (RL1-3) of the relay (RL), and forming a current path to the second transistor switching means (TR2); a second time constant circuit (R8, R9 and C2) having a discharging time contant and, connected to the second relay contact (RL1-3) of the relay (RL) and the first transistor switching means (TR1); and a third transistor switching means (TR3) connected to the second time constant circuit (R8, R9 and C2) and the second transistor switching means (TR2) for maintaining the second transistor switching means (TR2) in its conductive state by changing into a conductive state and for changing the second transistor switching means (TR2) into its interrupted state by changing into an interrupted state according to a discharging current flowing in the second time constant circuit (R8, R9 and C2).

In the self-holding circuit according to this invention, the first transistor switching means (TR1) changes into a conductive state in response to an ON-operation of the manual switch (SW2), thereby charging the first time constant circuit (R3 and C1), and the second transistor switching means (TR2) changes into a conductive state according to a charging current flowing in the first time constant circuit (R3 and C1). Thus the relay coil (RL1-1) of the relay (RL) is excited and an electric current is supplied to the output terminal (3) from the power source (20).

Even when the manual switch (SW2) is switched off after this, the electric supply to the output terminal (3) is continued because the second transistor switching means (TR2) is maintained in the ON-state by the third transistor switching means (TR3).

When the manual switch (SW2) is switched on again, the third transistor switching means (TR3) changes into an OFF-state according to a discharging current flowing in the second time constant circuit (R8, R9 and C2), thereby shutting off the electric supply to the output terminal (3).

DESCRIPTION OF THE PREFERRED EMBODIMENT

First of all, the self-holding circuit according to this invention will be described below on basis of FIG. 5 to FIG. 7.

Figure 5:
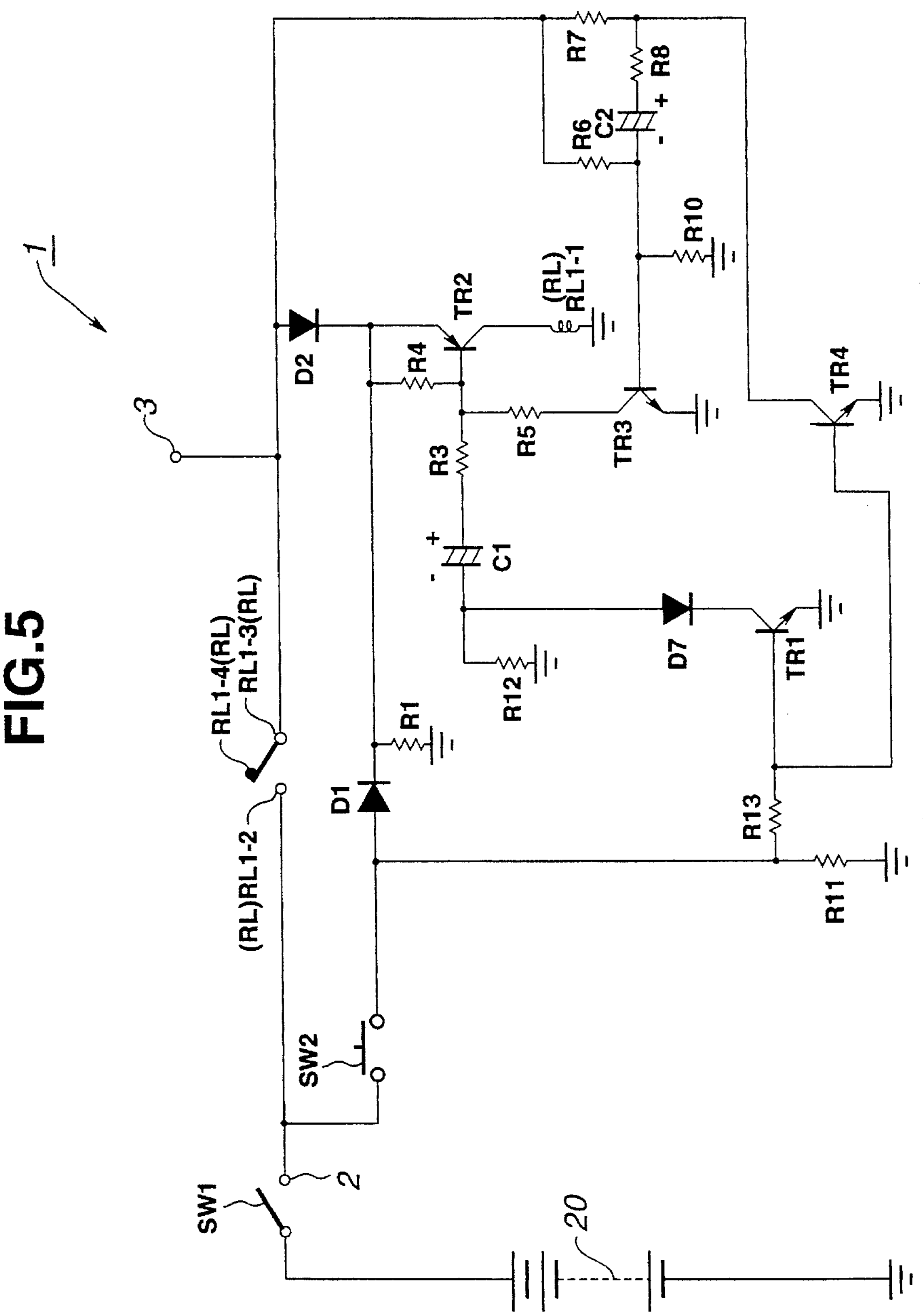
FIG. 5 is a circuit diagram of the first fundamental embodiment of a self-holding circuit according to this invention.

FIG. 5 is a circuit diagram illustrating the self-holding circuit according to the first fundamental embodiment of this invention.

A self-holding circuit shown in FIG. 5 is composed of an input terminal 2 to be supplied with an electric current from a power source 20 through a power switch SW1 connected to the power source 20; a push switch (manual switch) SW2 connected to the input terminal 2; resistors R11, R13 connected to the push switch SW2; transistors TR1, TR4, the bases of which are connected to the resistor R13; a first time constant circuit formed by a capacitor C1 connected to the collector of the transistor TR1 and a resistor R3; a transistor TR2 the base of which is connected to the first time constant circuit (C1 and R3) and the emitter of which is connected to the push switch SW2 through a diode D1; a relay RL having a relay coil RL1-1 connected to the collector of the transistor TR2, a relay contact RL1-2 connected to the input terminal 2, and relay contacts RL1-3, RL1-4; an output terminal 3 connected to the relay contact RL1-3; a diode D2 connected between the relay contact RL1-3 and the emitter of the transistor TR2; a resistor R7 connected between the relay contact RL1-3 and the collector of the transistor TR4; a transistor TR3 the base of which is connected to the relay contact RL1-3 through a resistor R6 and the collector of which is connected to the base of the transistor TR2 through a resistor R5; a second time constant circuit formed by a capacitor C2 connected between the collector of the transistor TR4 and the base of the transistor TR3, and a resistor R8; a resistor R1 connected between the cathode of the diode D1 and the earth; a resistor R4 connected between the emitter and the base of the transistor TR2; a resistor R10 connected between the base and the emitter of the transistor TR3; and a resistor R12 connected between the collector of the transistor TR1 and the earth.

When the push switch SW2 is closed when the power switch SW1 is closed, an electric current is supplied to the resistors R11, R13 and the transistors TR1, TR4 from the power source 20 and the transistors TR1, TR4 change into conductive states (ON-state). At the same time, the electric current flows in the diode D1 and the resistor R1 and also in the resistors R4, R3 and the capacitor C1 through the diode D1, whereby the transistor TR2 also changes into a conductive state. According to the conductive state of the transistor TR2, the collector current of the transistor TR2 is supplied to the relay coil RL1-1 and the relay contacts RL1-2 and RL1-3 are closed.

Consequently, the electric current is supplied to the output terminal 3 from the power source 20 and the diode D2 is in a conductive state. At the same time, the transistor TR4 is supplied with the electric current through the resistor R7 and the electric current is also supplied to the resistors R6, R10 and the transistor TR3, whereby the transistor TR3 changes into a conductive state. Furthermore, the base current of the transistor TR2 is supplied to the collector of the transistor TR3 through the resistor R5.

The electric current flowing to the capacitor C1 and the transistor TR1 decreases as the capacitor C1 is charged, and becomes extinct before long. However, the transistor TR2 is maintained in the conductive state because the base current of the transistor TR2 is maintained through the resistor R5 and the transistor TR3. Even when the push switch SW2 moves into a non-conductive state (OFF-state) by releasing the push button of the switch SW2, the electric current continuously flows to the relay coil RL1-1 from the input terminal 2 through the relay contacts RL1-2, RL1-3, the diode D2 and the transistor TR2, therefore the relay RL is self-held and the relay contacts RL1-2 and RL1-3 are never opened. Thus the electric supply to the output terminal 3 is maintained. In this case, the time constant of the resistor R3 and the capacitor C1 is selected so that the transistor TR2 may be maintained until the transistor TR3 changes into the conductive state.

When the push switch SW2 moves into the OFF-state, the electric current flowing in the push switch SW2 is interrupted, the diode D1 enters into a reverse biassing state and changes into a non-conductive state. Also the transistors TR1, TR4 change into non-conductive states. If the charging of the capacitor C1 is not completed when the transistor TR1 changes into the non-conductive state, the capacitor C1 is supplied with the charging current through the resistor R12, if the charging of the capacitor C1 is completed, the charging current does not flow. When the transistor TR4 changes into the non-conductive state, the charging current flows in the capacitor C2 through the resistors R7, R8, thereby charging the capacitor C2. At this time, the transistor TR3 is supplied with the base current through the resistor R6, therefore the transistor TR3 is maintained in the conductive state after the capacitor C2 is charged completely.

When the push switch SW2 is operated on for the second time, the transistors TR1, TR4 change into the conductive states, respectively. However, the collector current does not flow to the transistor TR1 through the resistor R3 and the capacitor C1 because the capacitor C1 is fully charged. On the other side, electrical charge stored in the capacitor C2 is discharged through the resistor R8, the transistor TR4 and the resistor R10, consequently the transistor TR3 changes into a non-conductive state. Therefore, the base current of the transistor TR2 is extinguished and the transistor TR2 changes into a non-conductive state. The relay coil RL1-1 is not supplied with the electric current through the transistor TR2, the relay contacts RL1-2 and RL1-3 are opened and the relay contact RL1-3 is connected with the normal-closed relay contact RL1-4. Accordingly, the electric supply to the output terminal 3 is shut off. The transistor TR3 is not supplied with the base current after the capacitor C2 is discharged completely and the transistor TR3 is maintained in the non-conductive state. The diode D2 is of course biassed reversely and changes into the non-conductive state after the relay contacts RL1-2 and RL1-3 are opened.

When the push switch SW2 becomes into the OFF-state for the second time, the transistor TR1, TR4 are changed again into the non-conductive states, and electrical charge stored in the capacitor C1 is discharged through the resistors R3, R4, R1 and R12. Consequently, the self-holding circuit 1 returns to the initial state.

Thus, the self-holding circuit 1 is so designed as to supply an electric current to the output terminal 3 according to the first ON-operation of the push switch SW2 and to shut off the electric supply to the output terminal 3 according to the second ON-operation of the push switch SW2 after the push switch SW2 is changed into the OFF-state by releasing the push button of the push switch SW2.

Figure 6:
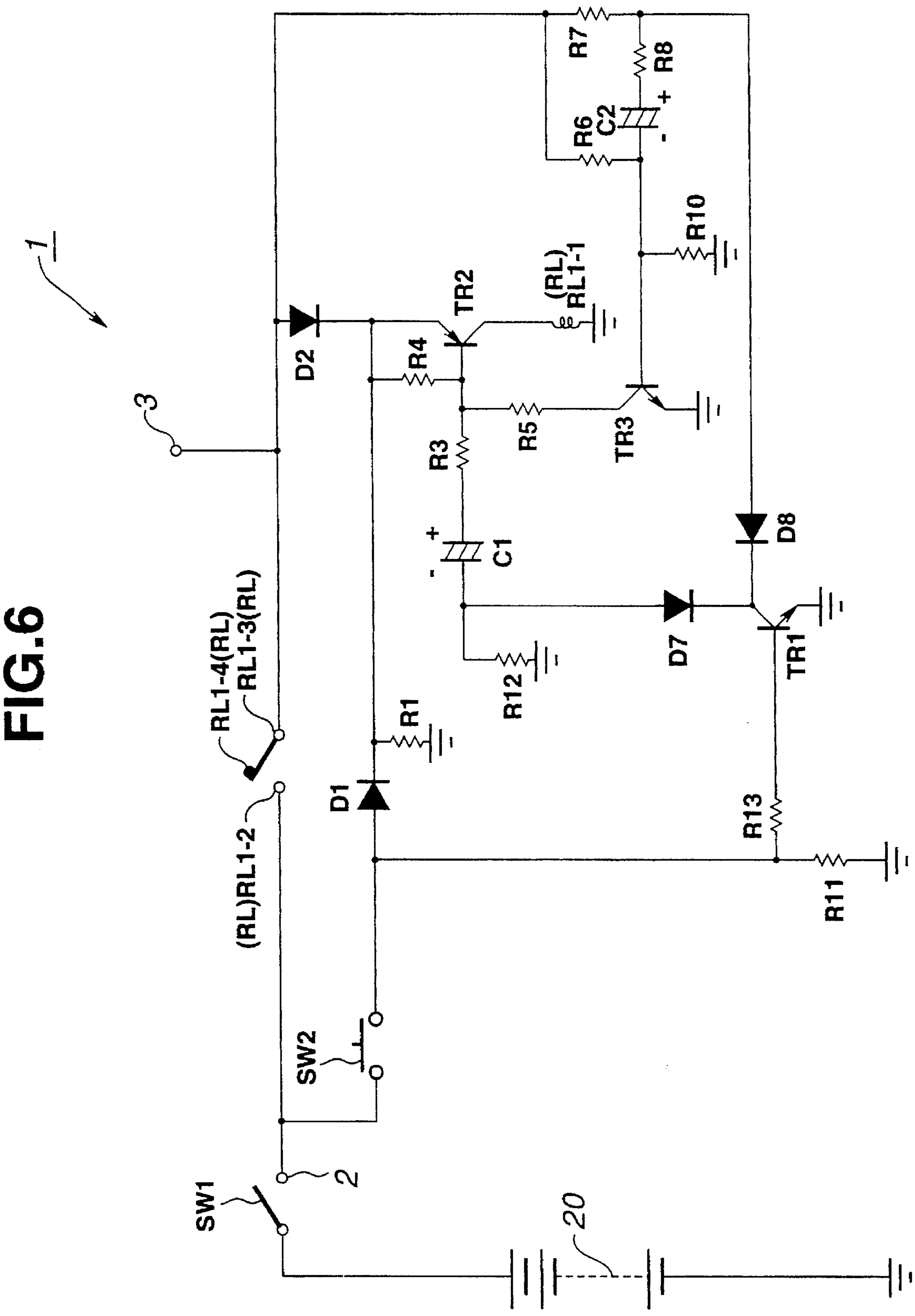
FIG. 6 is a circuit diagram of the second fundamental embodiment of a self-holding circuit according to this invention.

FIG. 6 is a circuit diagram illustrating the self-holding circuit according to the second fundamental embodiment of this invention. In this circuit, the transistor TR1 and diodes D7, D8 are used in place of the transistors TR1 and TR4 in the circuit of FIG. 5. There is not any difference substantially in the function of this circuit as compared with the circuit shown in FIG. 5.

Figure 7:
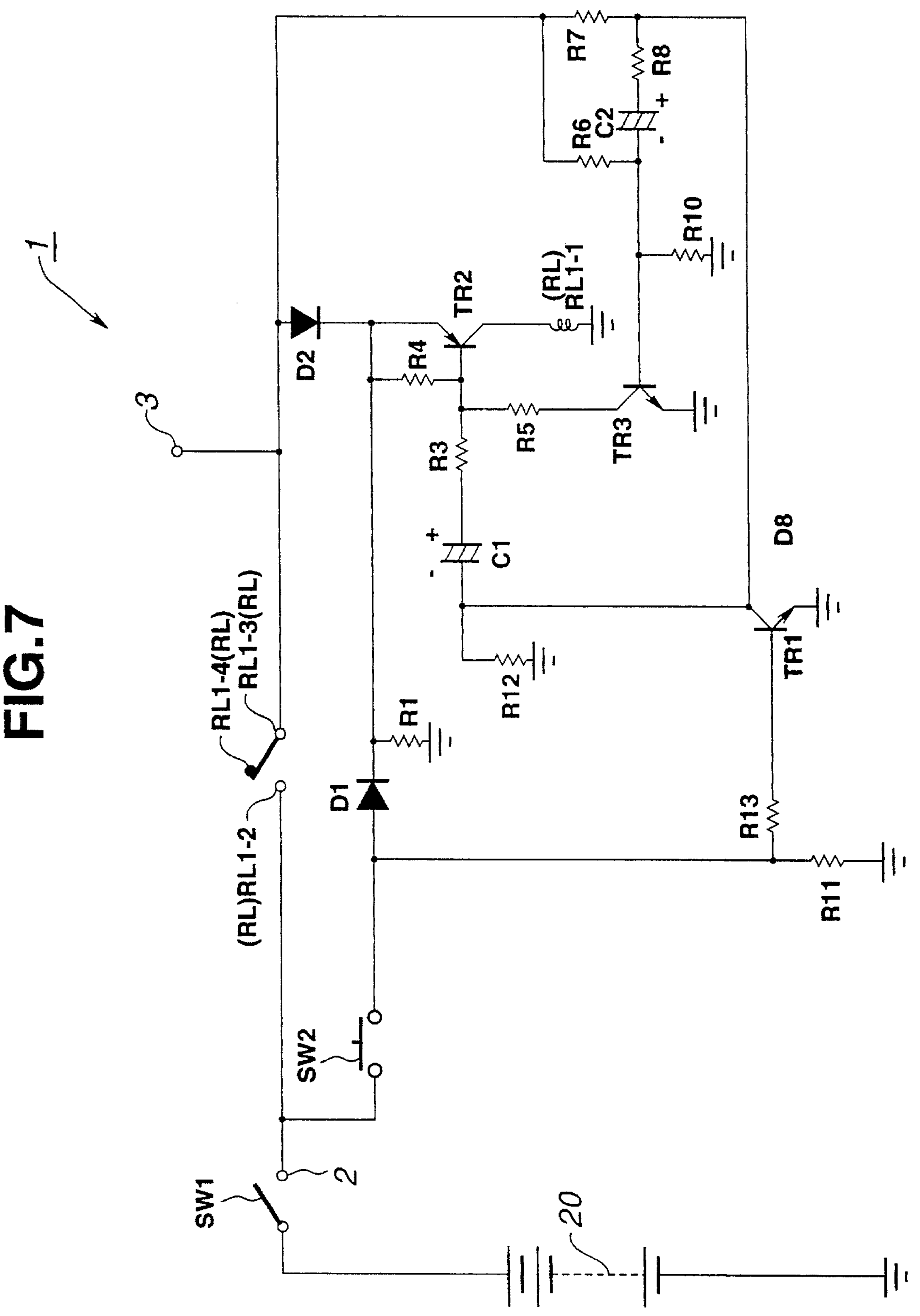
FIG. 7 is a circuit diagram of the third fundamental embodiment of a self-holding circuit according to this invention.

FIG. 7 is a circuit diagram illustrating the self-holding circuit according to the third fundamental embodiment of this invention. In this circuit, the diodes D7 and D8 in the circuit shown in FIG. 6 are omitted.

In the third fundamental embodiment, the functioning at the time of ON-operation of the push switch SW2 in the initial state is the same as that of the second fundamental embodiment substantially, but there are some differences in the functioning of the circuit after the push switch SW2 moves into the OFF-state.

Namely, when the push switch SW2 is operated into the OFF-state after the push switch SW2 is switched on for the first time, the transistor TR1 changes into the non-conductive state. On the other side, the diode D2 and the transistor TR2 are in the conductive states. Therefore, the discharging path of the capacitor C1 is formed through the resistor R3, the transistor TR2, the diode D2, the resistor R7 and the collector terminal of the transistor TR1, and the electrical charge stored in the capacitor C1 is discharged. Accordingly, when the push switch SW2 enters into the ON-state for the second time and the transistor TR1 changes into the conductive state, the base current flows to the transistor TR2 through the transistor TR1, the capacitor C1 and the resistor R3, and the transistor TR2 is maintained in the conductive state. Namely, the discharging current of the capacitor C1 further flows after the transistor TR1 changes into the conductive state and the transistor TR3 changed into the non-conductive state according to the discharging of the capacitor C2, whereby the transistor TR2 is maintained in the conductive state and the electric current flows also in the relay coil RL1-1. Therefore, the relay contacts RL1-2 and RL1-3 are not opened immediately. However, the base current of the transistor TR2 flowing in the capacitor C1 decreases gradually according to the progression of the charge for the capacitor C1, and becomes extinct before long. If the transistor TR3 is maintained in the non-conductive state at this time, the transistor TR2 enters into non-conductive state, the electric current flowing in the relay coil RL1-1 is interrupted and the relay contacts RL1-2 and RL1-3 are opened. Namely, in this embodiment, the charging time constant of the time constant circuit composed of the capacitor C1 and the resistor R3 is selected so that the transistor TR2 may change into the non-conductive state from the conductive state while the transistor TR3 is being in the non-conductive state in consideration of the discharging time constant of the time constant circuit composed mainly of the capacitor C2 and the resistors R8, R10.

Also in this embodiment, the electric current is supplied to the output terminal 3 from the power source 20 according to the first ON-operation of the push switch SW2 at the initial state, and the electric current supplied to the output terminal 3 is shut off according to the second ON-operation of the push switch SW2.

Next, another embodiment of the self-holding circuit acording to this invention will be described below on basis of FIG. 1 to FIG. 4.

Figure 2:
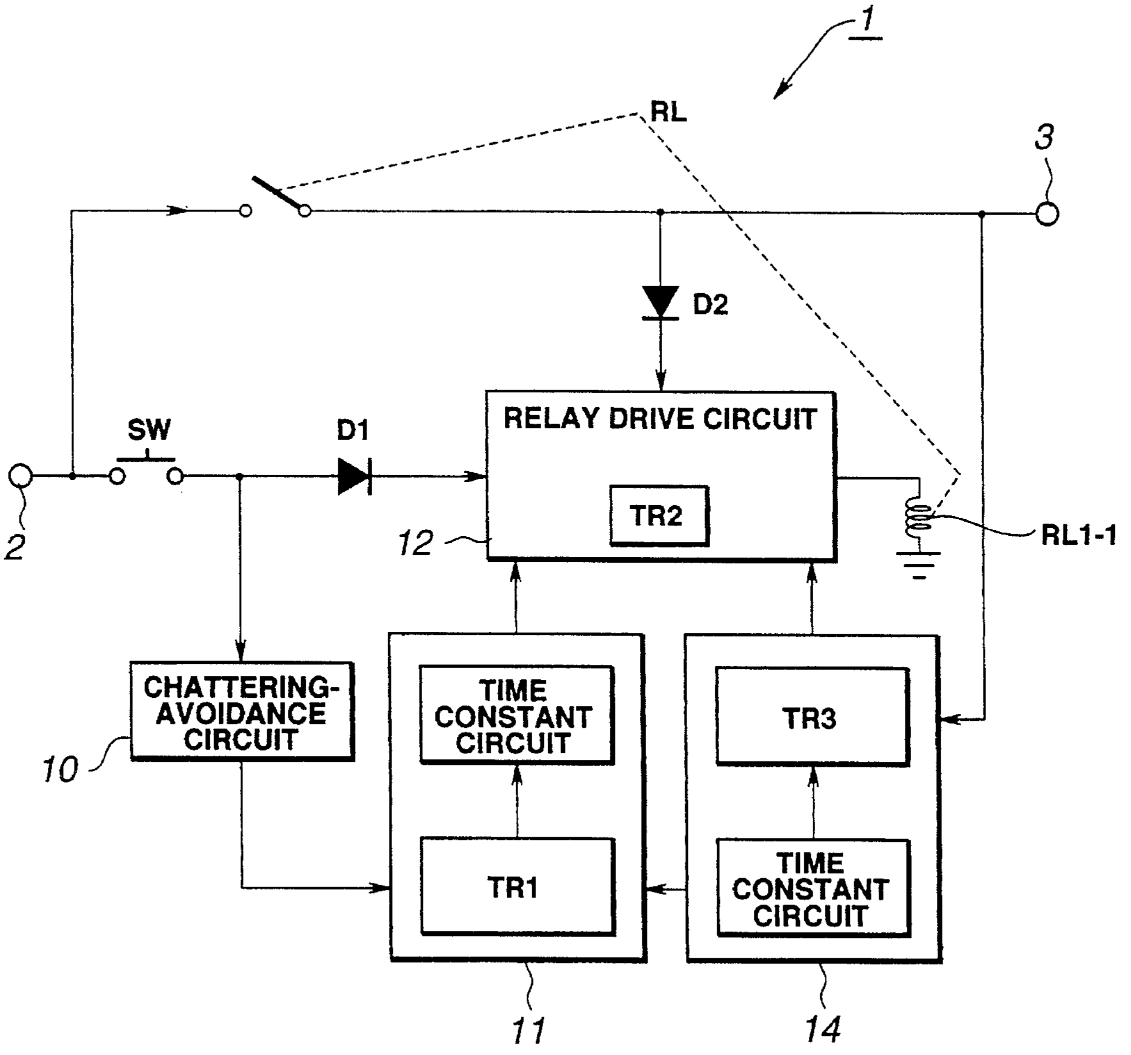
FIG. 2 is a basic block diagram of the self-holding circuit shown in FIG. 1.

As shown in FIG. 2 as a block diagram, a self-holding circuit 1 is composed mainly of an input terminal 2, a switch SW, a chattering-avoidance circuit 10, a temporary holding circuit 11, a relay drive circuit 12, a holding and cancelling circuit 14, a relay RL and an output terminal 3.

Figure 1:
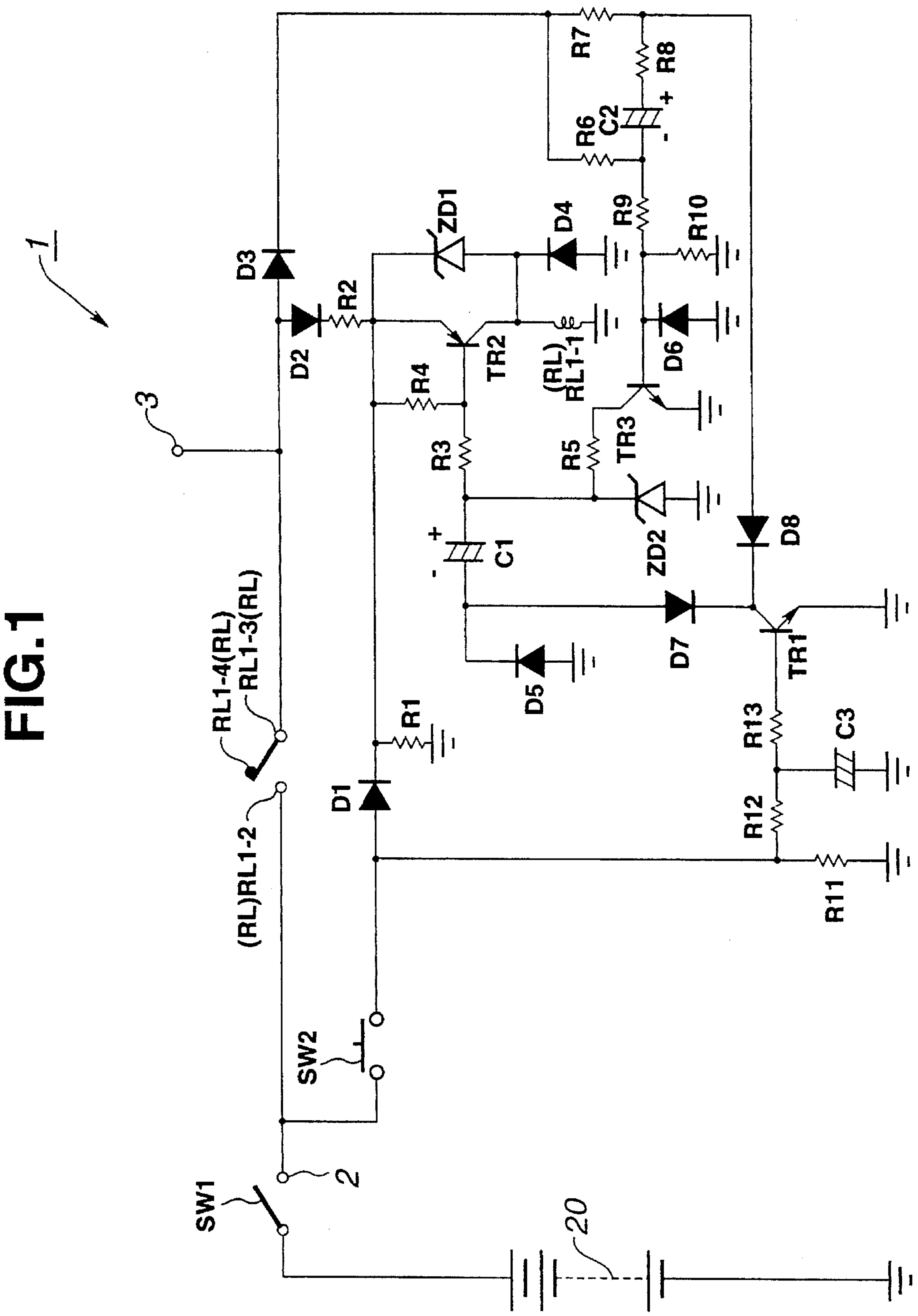
FIG. 1 is a circuit diagram of an embodiment of a self-holding circuit according to this invention.

In the circuit diagram shown in FIG. 1, a first switch SW1 is the ignition switch and non-returnable type, which is so structured as to be maintained in an ON-state by ON-operation thereof. The first switch SW1 is connected to a power source 20 at one end and connected to a normal open-fixed contact (relay contact) RL1-2 of the relay RL at another end thereof. Voltage of the power source 20 is applied on the input terminal 2 by the ON-operation of the first switch SW1.

A second switch SW2 corresponds to the switch SW in FIG. 2 and is a self-returnable type which is so designed as to change into an ON-state only when the switch button is being pressed by an operator. The second switch SW2 is connected to the input terminal 2 at one end and the other end of the second switch SW2 is connected to a resistor R12 of the chattering-avoidance circuit 10 described later add connected to a resistor R11.

Further, the other end of the second switch SW2 is the anode of a diode D1 for preventing a reverse current, the cathode of the diode D1 is connected to one end of a resistor R1 of which other end is grounded and connected to one end of a resistor R4 of the relay drive circuit 12.

The chattering-avoidance circuit 10 connected to the other end of the second switch SW2 is provided with the resistor R11, the resistor R12, a resistor R13 and a capacitor C3.

When the second switch SW2 changes into the ON-state, the chattering-avoidance circuit 10 supplies the base current to a first transistor TR1 of the temporary holding circuit 11 described later through a base resistor, that is the resistor R13, thereby switching on a first transistor TR1 after predetermined time according to the time constant (T3) set by the resistor R13 and the capacitor C3 since the second switch SW2 is switched on.

When the second switch SW2 is switched off from the ON-state, the electrical charge stored in the capacitor C3 of the chattering-avoidance circuit 10 is discharged through the resistors R11 and R12. The resistor R11 ensures the OFF-state of the first transistor TR1 of the temporary holding circuit 11.

The chattering-avoidance circuit 10 has the time constant T3 based on the resistor R12 and the capacitor C3 and monitors an ON-opoeration period of the second switch SW2 by maintaining the first transistor TR1 of the temporary holding circuit 11 so as not to be switched on in a case where the second switch SW2 is switched on in a relative short period without intention. The resistor R13 of the chattering-avoidance circuit 10 is connected to the base of the first transistor TR1 of the temporary holding circuit 11.

The temporary holding circuit 11 is provided with the first transistor TR1, diodes D7 and D5 for preventing the reverse current, a resistor R3 and a capacitor C1. The diode D5 is used in place of the R12 shown in the aforementioned fundamental embodiments.

One end of the capacitor C1 is connected to the cathode of the diode D1 through a resistor R4 of the relay drive circuit 12 and the resistor R3, and connected to the base of a second transistor TR2 in the relay drive circuit 12 through the resistor R3.

The temporary holding circuit 11 switches on the second transistor TR2 in the relay drive circuit 12, since the first transistor TR1 changes into the ON-state by being supplied with the base current through the chattering-avoidance circuit 10 according to the ON-operation of the second switch SW2 in the ON-state of the first switch SW1, whereby an electric path from the power source 20 is formed through the first and second switches SW1, SW2, the diode D1, the resistors R4, R3, the capacitor C1 and the diode D7.

At this time, the resistor R3 and the capacitor C1 are connected in series to the base of the second transistor TR2, and the temporary holding circuit 11 supplies the base current to the second transistor TR2 in the relay drive circuit 12 for a period as much as time t2 according to the time constant (T1) set by the resistor R3 and the capacitor C1.

Figure 3:
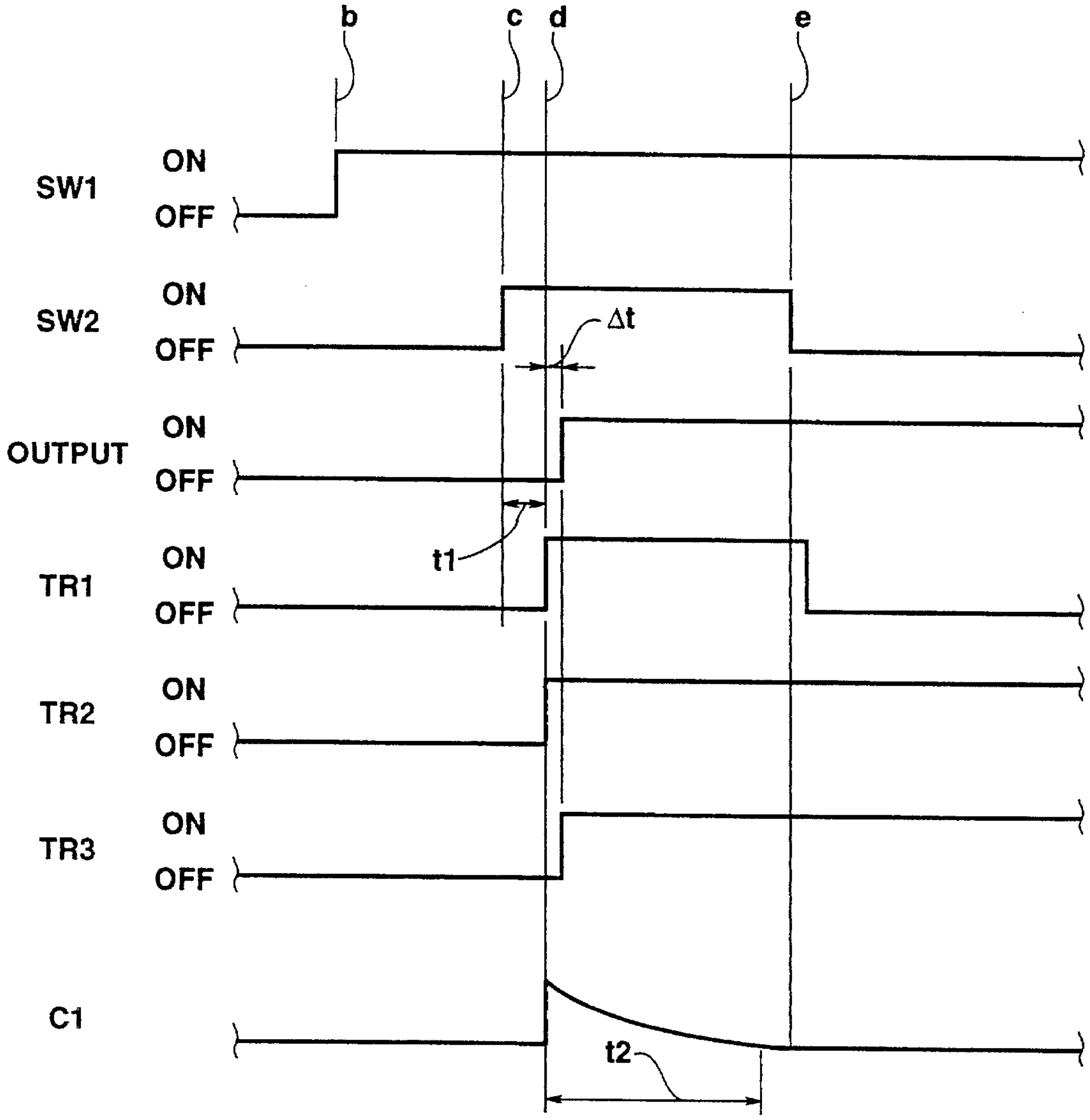
FIG. 3 is a time chart illustrating the functioning of the self-holding circuit shown in FIG. 1.

A relay coil RL1-1 of the relay RL of which one end is connected to the collector of the second transistor TR2 and another end grounded is excited when the second transistor TR2 is switched on by the temporary holding circuit 11 at time d shown in FIG. 3, whereby a movable contact (relay contact) RL1-3 of the relay RL is connected to the normal open-fixed contact RL1-2 after a time lag of $\Delta t$ since the time d and the electric current is supplied to the output terminal 3 from the power source 20.

The holding and cancelling circuit 14 is provided with a diode D3 to prevent a reverse current, resistors R5, R6, and a third transistor TR3. The resistor R5 is connected to a node between the capacitor C1 and the resistor R3.

According to the electric contact between the normal open-fixed contact RL1-2 and the movable contact RL1-3 of the relay RL, the third transistor TR3 is supplied with the base current through the diode D3, the resistor R6 and a resistor R9, thereby switching on the third transistor TR3 after the time lag of Δt since the time d shown in FIG. 3. An electric path is formed through the diode D2, a resistor R2, the second transistor TR2 and the resistors R3, R5 due to the ON-state of the third transistor TR3. Accordingly, the second transistor TR2 is continuously supplied with the base current through the resistors R3, R5, thereby flowing the electric current in the relay coil RL1-1 of the relay RL even after the electric path formed through the first and second switches SW1, SW2, the diode D1, the resistors R4, R3, the capacitor C1 and the diode D7 by the temporary holding circuit 11 is interrupted in consequence of the termination of the charging in the capacitor C1.

The holding and cancelling circuit 14 discharges the capacitor C1 of the temporary holding circuit 11 through the discharging path formed with the resistor R5, the second transistor TR2 and the diode D5, and decreases the electrical charge stored in the capacitor C1 when the first transistor TR1 is changed off by the discharging of the capacitor C3 in the chattering-avoidance circuit 10 on basis of the discharging time constant according to the OFF-operation of the second switch SW2 in the ON-state of the first switch SW1 at time e shown in FIG. 3. Furthermore, a capacitor C2 disposed in the holding and cancelling circuit 14 is charged through a charging path formed by resisters R7 and R8.

The holding and cancelling circuit 14 is provided with the resistor R9 connected to the base of the third transistor TR3, the capacitor C2, the resisters R7, R8, a resistor R10 and diodes D8, D6 for preventing a reverse current.

In the holding and cancelling circuit 14, the main discharging time constant T2 is set by the capacitor C2 and the resisters R8, R9. The time constant T2 set by the capacitor C2 and the resisters R8, R9 is longer than the time consatnt T1 set by the resistor R3 and the capacitor C1 in the temporary holding circuit.

When the second switch SW2 is switched on for the second time from the OFF-state at the ON-state of the first switch SW1, the first transistor TR1 in the temporary holding circuit 11 changes into the ON-state, the capacitor C2 is discharged according to the time constant T2 through the resistor R8, the diode D8, the first transistor TR1, the diode D6 and the resistor R9 and reversely biasses the base current of the third transistor TR3. Accordingly, the third transistor TR3 is switched off and the electric path to the relay coil RL1-1 1 of the relay RL maintained by the holding and cancelling circuit 14 is interrupted, thereby cutting off the electric current supplied to the output terminal 3. The resistor R10 is used for ensuring the OFF-state of the third transistor TR3 disposed in the holding and cancelling circuit 14.

A first and a second zener diodes ZD1 and ZD2 are used for protecting from a surge current, and a diode D4 is used for absorbing the surge current in the relay coil RL1-1 of the relay RL and for delaying off-timing of the relay coil RL1-1 in some degree.

Figure 4:
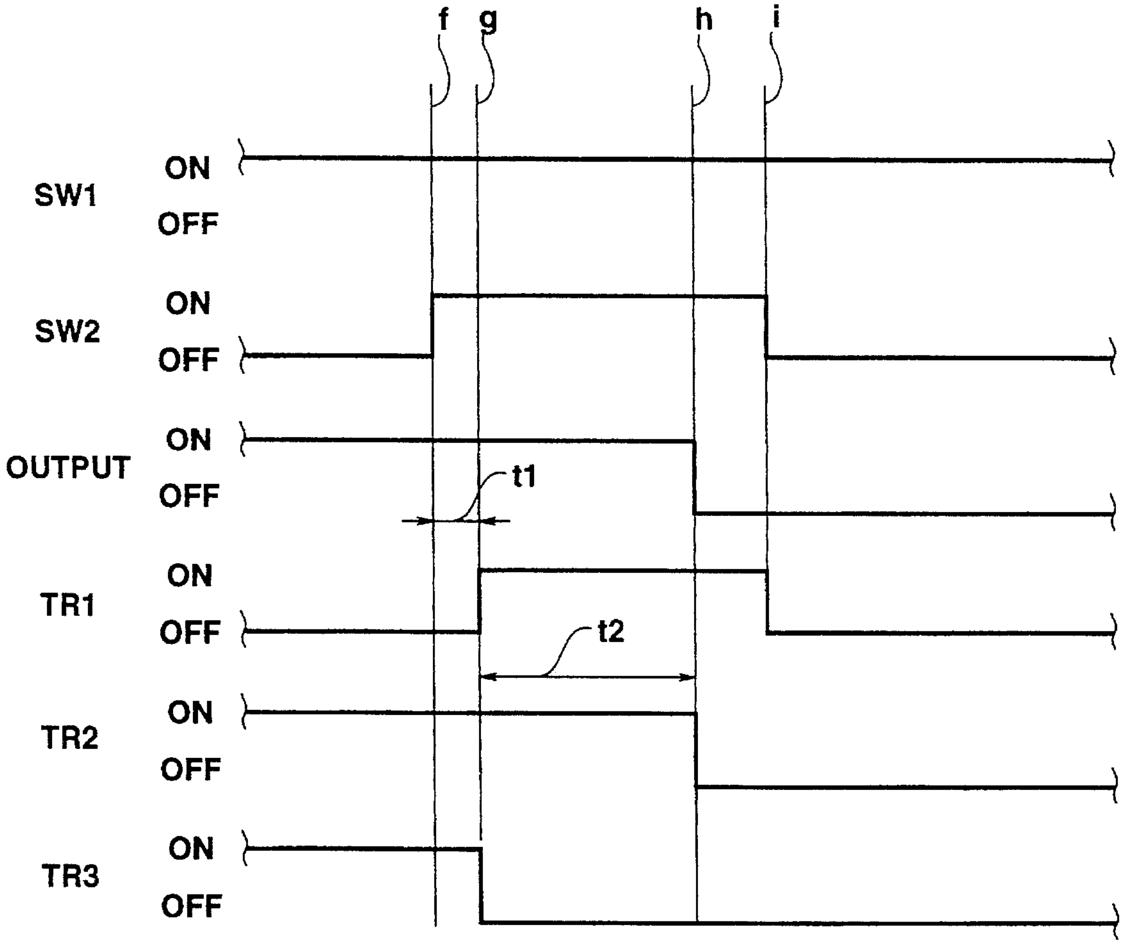
FIG. 4 is a time chart illustrating the functioning of the self-holding circuit shown in FIG. 1.

The self-holding circuit 1 having the aforementioned structure functions as shown in FIG. 3 and FIG. 4.

By switching on the second switch SW2 at time c after switching on the first switch SW1 at time b as shown in FIG. 3, the first transistor TR1 of the temporary holding circuit 11 changes into the ON-state at time d after a period t1 according to the time constant T3 set by the resistor R12 and the capacitor C3 of the chattering-avoidance circuit 10. An excitation current flows in the relay coil RL1-1 of the relay RL and the movable contact RL1-3 is contacted with the normal open-fixed contact RL1-2 of the relay RL since the second transistor TR2 changes into the ON-state in a moment according to the ON-state of the first transistor TR1, whereby the electric current is supplied to the output terminal 3 at time (d+Δt) after the time lag of Δt since the time d.

Although the base current supplied to the second transistor TR2 by the first transistor TR1 in the ON-state becomes extinct after the lapse of a period based on the time constant T1 set by the capacitor C1 and the resistor R3 in the temporary holding circuit 11, the second transistor TR2 is still maintained in the ON-state after the second switch SW2 is switched off at time e since the third transistor TR3 of the holding and cancelling circuit 14 is changed on by the electrical contact between the movable contact RL1-3 and the normal open-fixed contact RL1-2 of the relay RL and supplies continuously the base current to the second transistor TR2.

Namely, the electric current is supplied from the power source 20 to the output terminal 3 by the ON-operation of the second switch SW2 when the first switch SW1 is switchted on, and then the electric current is still supplied continuously even when the second switch SW2 is switched off at time e by releasing the push button.

Furthermore, when the second switch SW2 is switched on for the second time from the OFF-state at time f as shown in FIG. 4 (in this time, the first switch SW1 is in the ON-state and electric current is further supplied to the output terminal 3 from the power source 20), the first transistor TR1 of the temporary holding circuit 11 changes into the ON-state at time g after the period t1 determined by the time constant T3 set by the capacitor C3 and the resistor R12 in the chattering-avoidance circuit 10 similarly to the first ON-operation of the second switch SW2. When the first transistor TR1 changes into the ON-state at the time g, the third transistor TR3 of the holding circuit 13 is reversely biassed according to the time constant T2 set by the capacitor C2 and the resistors R8, R9 in the holding and cancelling circuit 14, whereby the third transistor TR3 also changes into the OFF-state at the time g. Although, the electric path through the resistors R3 and R5 is interrupted according to the OFF-state of the third transistor TR3, the second transistor TR2 is maintained in the ON-state for a while and changes into the OFF-state at time h depending on the time constant T1 set by the capacitor C1 and the resistor R3. The time constant T2 is selected to be sufficiently larger than the time constant T1, and the second transistor TR2 changes into the OFF-state at the time h during the OFF-state of the third transistor TR3. When the second transistor TR2 changes into the OFF-state at the time h, the electric path to the relay coil RL1-1 of the relay RL is interrupted, whereby the movable contact RL1-3 returns to the normal close-fixed contact (relay contact) RL1-4 from the normal open-fixed contact RL1-2 of the relay RL and the electric supply to the output terminal 3 is shut off.

Namely, when the second switch SW2 is switched on from the OFF-state at the second time in the ON-state of the first switch SW1, the electric supply to the output terminal 3 is shut off (at the time h) after the period added with the period t2 corresponding to the duration of the second transistor TR2 in the ON-state depending on the time constant T1 set by the resistor R3 and the capacitor C1 in the temporary holding circuit 11 to the time lag t1 determined depending on the time constant T3 set by the resistor R12 and the capacitor C3. Then, the second switch SW2 is switched off by releasing the push button at time i, the first transistor TR1 changes into the OFF-state.

As mentioned above, in the self-holding circuit according to this invention and having the aforementioned construction, it is possible to apply output voltage on the output terminal by switching on the manual switch for the first time, and possible to interrupt the output voltage by switching on the manual switch for the second time. An excellent effect can be obtained in that it is possible to switch over the circuit into the ON-state and OFF-state by using merely one manual switch of the self-returnable type such as a push button switch, for example.

What is claimed is:

1. A self-holding circuit for output voltage comprising:

an input terminal supplied with an electric current from a power source;

an output terminal;

a manual switch of self-returnable type connected to said input terminal;

a first transistor switching means connected to said manual switch and changing into a conductive state in response to an ON-state of said manual switch;

a first time constant circuit having a charging time constant, connected to said first transistor switching means and charge according to the conductive state of said first transistor switching means;

a second transistor switching means connected to said first time constant circuit connected to said manual switch through a first diode and changing into a conductive state according to a charging current flowing in said first time constant circuit;

a relay having a relay coil connected to said second transistor switching means, a first relay contact connected to said input terminal and a second relay contact connected to said output terminal;

a second diode connected between said second transistor switching means and the second relay contact of said relay and forming a current path to said second transistor switching means;

a second time constant circuit having a discharging time constant and connected to the second relay contact of said relay and said first transistor switching means; and a third transistor switching means connected to said second time constant circuit and said second transistor switching means for maintaining said second transistor switching means in its conductive state by changing into a conductive state and for making said second transistor switching means into its interrupted state by changing into an interrupted state according to a discharging current flowing in said time constant circuit.

2. Transistor circuit as defined in claim 1, wherein said first transistor switching means includes a pair of transistors, the base electrodes of which are connected in parallel.

3. Transistor circuit as defined in claim 1, wherein said second time constant circuit comprises a first resistor and a first capacitor connected with the first resistor in series.

4. Transistor circuit as defined in claim 3, wherein said second time constant circuit further comprises a second resistor connected in series with the first capacitor and a third resistor connected in parallel with the series connected first resistor and first capacitor.

* * * * *